United States Patent [19]
Cappelletti et al.

[11] Patent Number: 5,793,675
[45] Date of Patent: Aug. 11, 1998

[54] METHOD OF EVALUATING THE GATE OXIDE OF NON-VOLATILE EPROM, EEPROM AND FLASH-EEPROM MEMORIES

[75] Inventors: Paolo Giuseppe Cappelletti, Seveso; Leonardo Ravazzi, Dalmine, both of Italy

[73] Assignee: SGS-Thomson Microelectronics S.r.l., Agrate Brianza, Italy

[21] Appl. No.: 829,935

[22] Filed: Apr. 1, 1997

Related U.S. Application Data

[63] Continuation of Ser. No. 140,629, Oct. 21, 1993.

[30] Foreign Application Priority Data

Oct. 29, 1992 [EP] European Pat. Off. ............ 92830589

[51] Int. Cl.⁶ .................................................. G11C 29/00
[52] U.S. Cl. ............... 365/185.09; 365/182; 365/185.33; 365/189.07; 365/201
[58] Field of Search ................. 365/185.09, 185.33, 365/201, 189.07, 182, 185.05, 63

[56] References Cited

U.S. PATENT DOCUMENTS

| | | | |
|---|---|---|---|
| 4,545,112 | 10/1985 | Holmberg et al. | 29/577 R |
| 4,779,272 | 10/1988 | Kohda et al. | 365/185.2 |
| 4,829,014 | 5/1989 | Yerman | 437/8 |
| 4,841,482 | 6/1989 | Kreifels et al. | 365/185 |
| 4,963,825 | 10/1990 | Mielke | 324/158 R |
| 5,155,701 | 10/1992 | Komori et al. | 365/182 |
| 5,243,554 | 9/1993 | Allen et al. | 365/185.03 |
| 5,247,346 | 9/1993 | Hazani | 365/185.12 |
| 5,253,206 | 10/1993 | Tanaka et al. | 365/185.17 |
| 5,283,454 | 2/1994 | Cambou | 257/328 |
| 5,295,105 | 3/1994 | Atsumi | 365/185.13 |
| 5,515,318 | 5/1996 | Cappelletti et al. | 365/185.09 |
| 5,604,699 | 2/1997 | Cappelletti et al. | 365/185.09 |

FOREIGN PATENT DOCUMENTS

| | | |
|---|---|---|
| A-0 017 808 | 10/1980 | European Pat. Off. |
| A-0 306 990 | 3/1989 | European Pat. Off. |
| A-3 637 682 | 5/1987 | Germany |

*Primary Examiner*—Do Hyun Yoo
*Attorney, Agent, or Firm*—Wolf, Greenfield & Sacks, P.C.; James H. Morris

[57] ABSTRACT

A method employing a test structure identical to the memory array whose gate oxide quality is to be determined, except for the fact that the cells are connected electrically parallel to one another. The test structure is so stressed electrically as to extract electrons from the floating gate of the defective-gate-oxide cells and so modify the characteristic of the cell while leaving the charge of the non-defective cells unchanged. In this way, only the threshold of the defective cells is altered. A sub-threshold voltage is then applied to the test structure, and the drain current through the cells, which is related to the presence of at least one defective cell in the structure, is measured. Measurement and analysis of the current-voltage characteristic provides for determining the number of defective cells. The method is suitable for in-line quality control of the gate oxide of EPROM, EEPROM and flash-EEPROM memories.

15 Claims, 3 Drawing Sheets

5,793,675

1

METHOD OF EVALUATING THE GATE OXIDE OF NON-VOLATILE EPROM, EEPROM AND FLASH-EEPROM MEMORIES

This application is a continuation of application Ser. No. 08/140,629, filed Oct. 21,1993, entitled METHOD OF EVALUATING THE GATE OXIDE OF NON-VOLATILE EPROM, EEPROM AND FLASH-EEPROM MEMORIES, now pending.

BACKGROUND OF THE INVENTION

1. Field of the Invention

The present invention relates to a method of evaluating the gate oxide of non-volatile EPROM, EEPROM and flash-EEPROM memories.

2. Discussion of the Related Art

The reliability of non-volatile memories of the aforementioned types is known to depend substantially on the quality of the gate oxide, evaluation of which is especially important in the case of flash-EEPROM memories, the cells of which, as shown in the FIG. 1 cross section of a flash-EEPROM cell 100, present a thinner gate oxide layer as compared with those of EPROM memories. More specifically, FIG. 1 shows a P type substrate 1; N type drain and source regions 2 and 3; a gate oxide layer 4; a floating gate region 5; a dielectric interpoly layer 6; a control gate region 7; and a protective oxide layer 8.

The gate oxide layer of flash-EEPROM memories presents a thickness of roughly 110 A (as compared with roughly 200 A for EPROM cells) so as to enable erasure of the flash cells by Fowler-Nordheim tunneling current at voltages leaving the cell itself undamaged. Passage of the tunneling current through the gate oxide, which may be defined as the tunnel oxide by virtue of performing the same functions as the tunnel oxide of EEPROM cells, thus enables electron removal from the floating gate.

In view of its functions, therefore, the flash cell tunnel oxide must be of guaranteed reliability both in terms of resistance to the electrical stress typical of EPROM memories, and in terms of erasure characteristics. Hence, the importance of an effective, reliable method of evaluating the quality of the tunnel oxide.

At present, this is done using tunnel oxide MOS capacitors made specially for the purpose, and wherein the area or perimeter of the capacitors (depending on the side of the cell being considered) is equivalent to that of the arrays used; and the test method itself consists in subjecting the capacitors to voltage or current stress, and evaluating the electric field or total charge at breakdown of the capacitor. At times, the entire current/voltage characteristic obtainable under stress is evaluated.

The above diagnosis and evaluation method, however, presents several drawbacks affecting its precision. To begin with, it has not yet been established beyond all doubt whether a correlation exists between the breakdown charge or electric field values and the presence of defective-oxide cells arrays manufactured in the same process.

Moreover, not even with the current/voltage characteristics obtained with the above known method is it possible to detect oxide defects when the degree of deficiency of the oxide is such as to affect only some. of the cells in the overall array. In fact, the currents responsible for the variation in the threshold of defective-gate-oxide cells, particularly at deficiency levels of a few defects per cm$^2$, are rarely measurable, due to the limitation posed by the noise level of the measuring instruments, and the presence at the same time of the gate current of the overall area of the capacitor. This latter factor becomes increasingly more stringent as the deficiency levels for detection get lower, thus requiring the measurement of increasingly higher-area capacitors and so impairing the measuring sensitivity of the method.

Even using known redundancy methods, the presence of even a small number of defective cells may result in breakdown of the memory. Consequently, as process efficiency and memory reliability depend on the degree of deficiency involved, it is essential that measuring instruments be made available that are capable of detecting even very low deficiency levels.

It is an object of the present invention to provide a method of detecting defective cells due to poor quality gate oxide, and which provides for improved diagnostic performance as compared with known methods and structures currently employed for the purpose.

SUMMARY OF THE INVENTION

According to the present invention, there is provided a method of evaluating the gate oxide quality of non-volatile EPROM, EEPROM and flash-EEPROM memories, comprising the steps of applying such a stress as to extract electrons from a floating gate region of at least one defective test cell and subsequently measuring the characteristic of the test cell.

Indeed, the present invention provides for a test structure identical to the memory array whose gate oxide quality is to be determined, which test structure is so stressed electrically as to only extract electrons from the floating gate of defective-gate-oxide cells in the structure. The test F structure is then subjected to a sub-threshold voltage; the current through the test structure cells, and which is related to the presence of defective cells, is measured; and the current-voltage characteristic is analyzedfor determining the number of defective cells. In this way, it is possible to detect the presence of even only one defective cell within the structure.

BRIEF DESCRIPTION OF THE DRAWINGS

The foregoing and other features and advantages of the invention will become more readily apparent from the following detailed description taken in conjunction with the accompanying drawings, in which.

DETAILED DESCRIPTION

Though reference is made in the following description to a flash-EEPROM memory, the present invention may also be applied to EPROM and EEPROM type memories.

Figure 1:
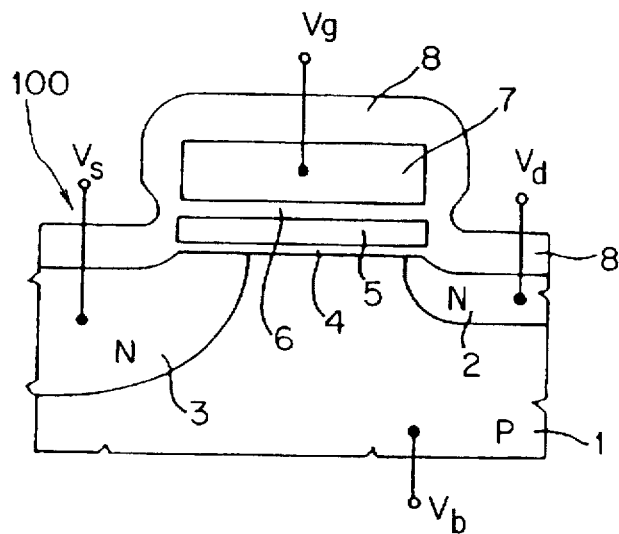
FIG. 1 shows a cross section of a known flash-EEPROM memory cell.
Figure 2:
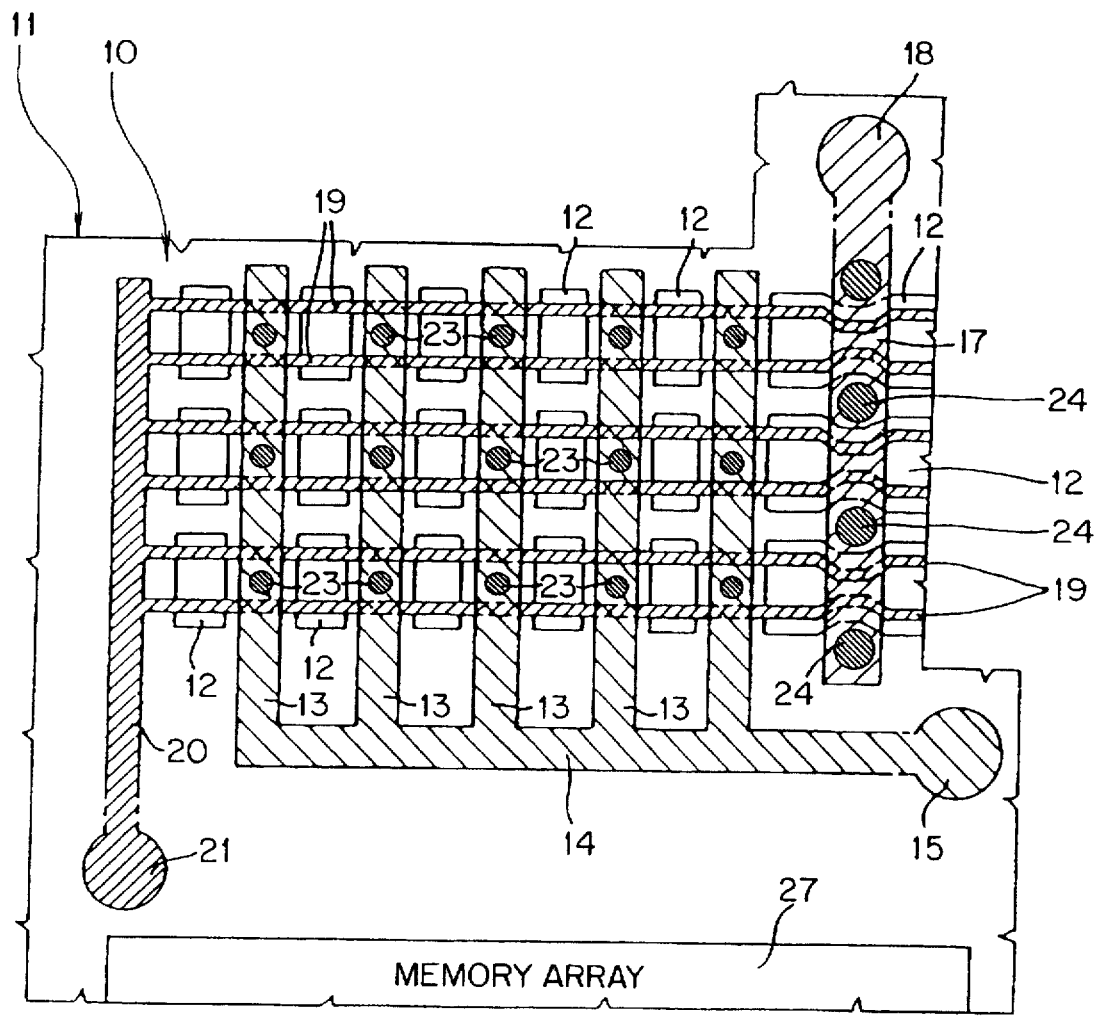
FIG. 2 shows a top plan view of the test structure employed according to the present invention.

FIG. 2 shows a top plan view of a flash-EEPROM memory test structure 10 identical to a standard memory array and therefore presenting a number of cells 100 as shown in FIG. 1. Unlike the standard array, however, and as shown in FIG. 2, the drain regions of cells 100 in structure 10 are all mutually connected by metal lines, as are also the source regions and control gate lines. More specifically, FIG. 2 shows: part of a wafer 11 of semiconductor material housing field insulating regions 12; metal drain lines 13 connected by a common portion 14 to a single pad 15; metal source line 17 connected to a single pad 18; polysilicon control gate lines 19 connected by a common portion 20 to a single pad 21; drain contacts 23; and source contacts 24. The areas in which field insulating regions 12 are absent and which are not covered by the gate lines constitute the source and drain regions.

Structure 10, which is accessible externally by means of pads 15, 18 and 21, is thus equivalent electrically to the parallel connection of all of cells 100.

Structure 10 may be formed inside the wafer itself and next to the standard memory arrays to be made operative (one of which is shown schematically by 27 in FIG. 2), in which case, structure 10 is fabricated using the same technology and simultaneously with arrays 27, so as to present the same characteristics (particularly as regards gate oxide quality) and give a reliable indication of the quality of the gate oxide of standard array 27.

Alternatively, for controlling the quality of the gate oxide, structure 10 may be formed on test wafers, in which case, the fabrication process is shortened by eliminating some of the steps required for forming the circuitry annexed to the standard arrays.

For evaluating the quality of the gate oxide, structure 10 is first U.V. erased, so as to render the floating gate of the cells electrically neutral, in which case, the drain current of the structure equals the current of each cell multiplied by the number of cells in the structure. When the, structure is stressed electrically in such a manner as to extract electrons from the floating gate of the defective-gate-oxide cells (which thus remains positively charged), and in such a manner as to leave the charge status of the other cells unchanged, the threshold voltage of the defective cells falls, while that of the other (non-defective) cells remains unchanged. Consequently, and particularly if the threshold voltage falls sufficiently (this normally depends on the complexity of structure 10 and is roughly 1 V for one-million cell structures), for gate voltage values below the threshold voltage of the defective cells, the drain or source current of the defective cells is greater than the total drain current of all the other cells.

Figure 3:
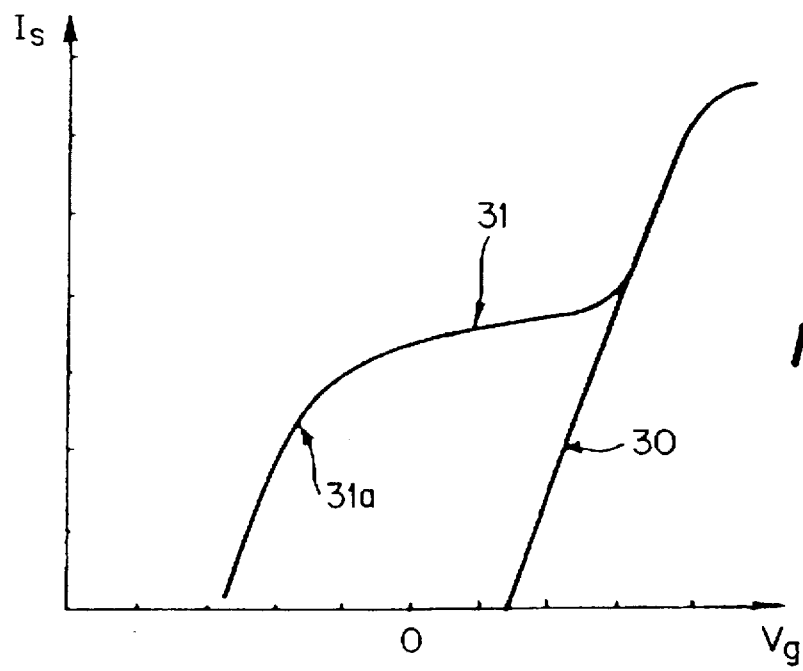
FIGS. 3 to 7 show electric graphs of the characteristic of the FIG. 2 structure.

The change in the characteristic of test structure 10 when stressed as described above is shown in FIG. 3, wherein curve 30 shows the source current as a function of gate voltage of a U.V. erased test structure 10, measured in the dark and with a zero gate voltage ($V_G=0$) and a current leakage of less than 1 nA. In general, source leakage, determined solely by the photocurrent generated in the space charge region of the overall source-substrate junction, is highly dependent on light intensity; and drain leakage is also affected by the inverted current of the drain-substrate junction, which depends both on the voltage applied to the drain and, closely, on temperature.

On applying a negative voltage to the control gate regions (7 in FIG. 1) or a positive voltage to the source regions (3), the electric field in the gate oxide (or tunnel oxide 4) in the floating gate 5-substrate 1 overlap regions (including source and drain diffusions 3 and 2) or respectively in the floating gate 5-source diffusion 3 overlap regions is directed towards floating gate 5. If the voltages applied are low enough to avoid Fowler-Nordheim tunneling through the potential barrier of the gate oxide of non-defective cells, electrons will only be lost from the floating gate of defective cells with an anomalous gate current at low electric fields, to give the structure 10 characteristic indicated by curve 31 in FIG. 3, which presents a "tail" 31a due to the presence of defective cells.

Figure 4:
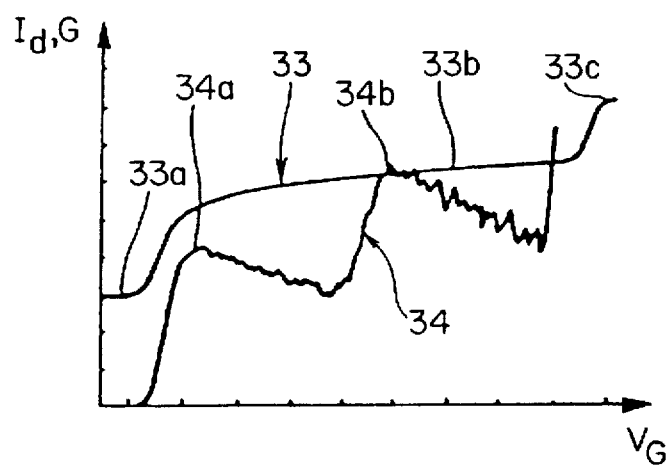

FIG. 4 shows the drain current $I_d$ (logarithmic-scale curve 33) and transconductance G ($dI/dV_G$–linear-scale curve 34) of a test structure 10 measured after applying one of the electric stresses described above. More specifically, curve 33 presents a first portion 33a indicating the inverse current of the drain-substrate junction; a second portion 33b indicating the modified portion of the characteristic due to a change in the threshold voltage of a number of cells; and a final portion 33c due to intervention of the overall array. The transconductance curve 34 presents two "humps" 34a and 34b, each due to the drain current produced by a respective defective-oxide cell being turned on at a voltage below the threshold voltage of the other none-defective cells. The transconductance curve thus provides for determining the number of defective cells, and, in particular, for indicating the presence of even only one defective cell.

Due to the impossibility, however, of devising an automatic, industrial-scale routine based on measurement and evaluation of the transconductance curve, two alternatives have been devised for evaluating the overall array.

According to a first solution, the structure is subjected to stress by a given source or gate voltage for fixed intervals of time; and the gate voltages at a predetermined source current (e.g. 300 nA) are measured before and after stress. If the difference in the voltages so measured exceeds a predetermined value, the structure is considered defective.

The above solution, however, poses problems as regards minimizing the stress time, and so enabling detection of defective arrays within an acceptable automated time frame, by virtue of the stress time varying widely according to the anomalous gate current, at low electric fields, of the defective cells.

A second preferred solution, which provides for overcoming the above problem, includes a ramped stress routine whereby the stress voltage is applied in steps, and the array characteristic measured after each-stress voltage step. The voltage ramp is practically equivalent to an exponential gate current ramp, so that the source current.of the defective cells is detected more rapidly as compared with the previous constant stress solution.

The following is a description of the second solution with reference to FIGS. 5 to 8. In the example shown, due to the effect on the drain current of drain substrate contact leakage, in addition to that caused by light intensity, the characteristic is measured using the source current.

To begin with, after U.V. erasing test structure 10, the current leakage of the structure is measured with (FIG. 1) $V_d=0.05$ V, $V_g=V_s=V_b=0$ V.; and, if the source leakage exceeds a predetermined threshold (e.g. 100 nA), the structure is not tested further. The same also applies to the drain leakage.

Figure 5:
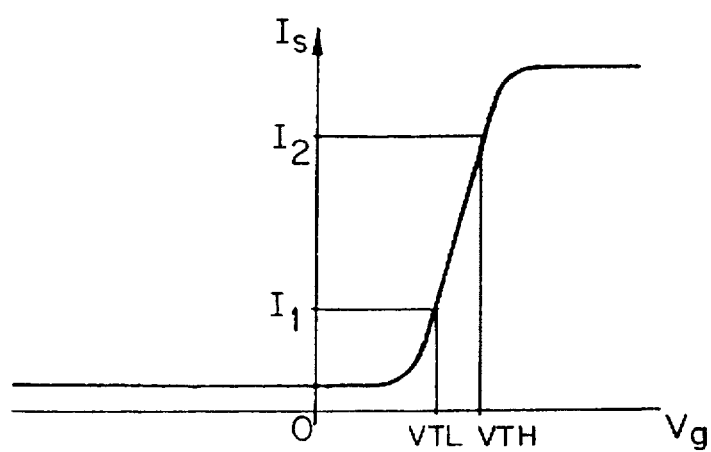

The characteristic of the structure ("virgin" characteristic) is then measured as shown in FIG. 5. More specifically, this phase includes measuring the VTL and VTH values of the gate voltage at two predetermined source current values $I_1$ and $I_2$ (e.g. 200 nA and 1.5 mA), the first affected by the deficiency "tail", and the second representing the intrinsic behavior of the structure, to show the deviation of the characteristic due to the Fowler-Nordheim effect.

The structure is then subjected to a first ramped stress phase, e.g. on the gate, wherein the negative gate voltage ($V_G$ in FIG. 8) is increased gradually from, say, −4 V, and in fixed increments of, say, −0.25 V, each stress voltage being maintained for a predetermined time of, say, 0.1 s. After each application of stress voltage $V_G$, value $V_1$ of gate voltage $V_G$ corresponding to source current value $I_1$ (FIG. 5) is measured and compared with the initial value VTL. If the difference (VTL−$V_1$) is less than a predetermined DV value, e.g. 100 mV (normally depending on the accuracy of the instrument), a higher stress voltage, increased as described above, is applied, and the stress and measuring cycle is repeated. Conversely, if VTL−$V_1 \geq$ DV, the $V_G$ value relative to the stress applied is memorized as VRL, and a second ramped stress phase is performed.

Figure 6:
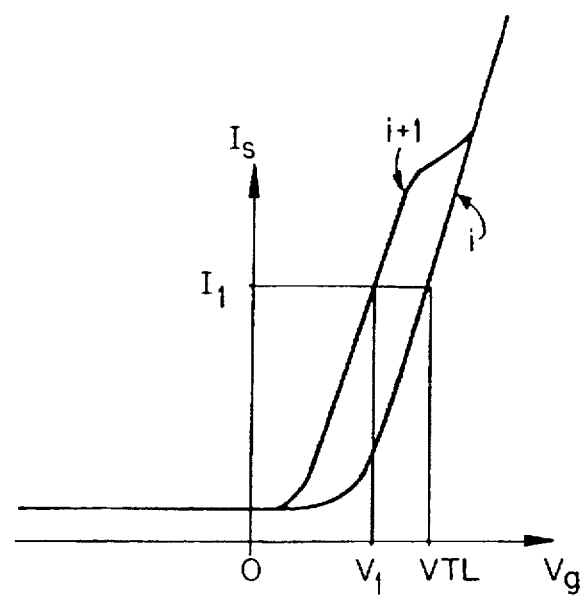

As shown in FIG. 6, VRL (relative to the (i+1)-th stress voltage cycle) indicates the stress responsible for a 0.1 V shift in the characteristic ("tail"), in turn due to a shift in the threshold of one or more defective cells.

As in the first phase, the second stress phase again consists in applying linearly-increasing voltage levels, and in measuring the characteristic after each application. More specifically, in the second phase, voltage $V_G$ corresponding to source current value $I_2$ is measured, and the resulting value $V_2$ of gate voltage $V_G$ is compared with the initial value VTH. If VTH−$V_2$<DV, a higher stress voltage is applied. Conversely, the $V_G$ value relative to the stress applied is memorized as VRH.

Figure 7:
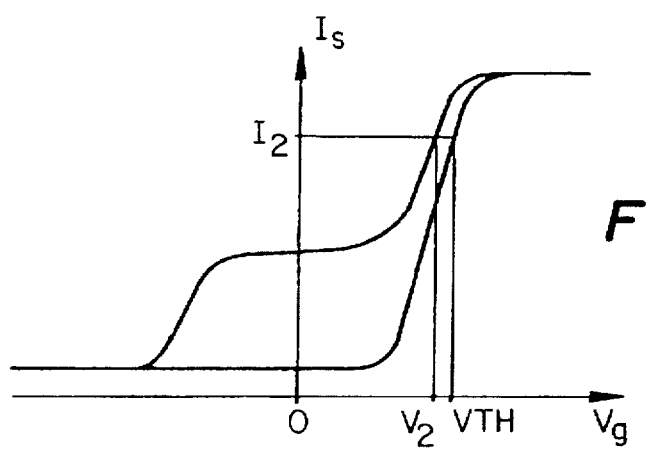
Figure 8:
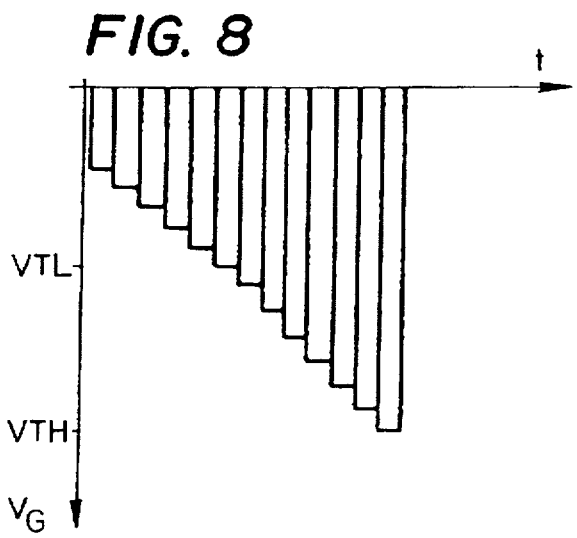
FIG. 8 shows the stress voltage applied to the FIG. 2 structure according to one embodiment of the method according to the present invention.

As shown in FIG. 7, VRH indicates the stress responsible for the shift in the characteristic due to a variation in the threshold voltage of the overall array; is related to the intrinsic quality of the cell gate oxide; and depends on the fabrication process parameters and technology.

At this point, the difference between the resulting VRL and VRH values is calculated, and if this exceeds a predetermined threshold (e.g. 1.5 V), the structure is considered defective.

The method may also comprise additional phases for comparing electric parameters and specific characteristic values, and for classifying the structure according to the results.

The advantages of the method and structure according to the present invention will be clear from the foregoing description. Firstly, even if the gate current under stress is less than the noise level of the measuring instruments and therefore not measurable directly, the method and structure according to the present invention provide for indirectly measuring the gate current via measurement of the drain or source current of the cell, and so enabling detection of even only one defective cell.

Secondly, unlike formerly used capacitors, the structural characteristics of which differ widely from those of the memory arrays, the test structure according to the present invention is physically equivalent to the memory arrays, with which it is formed simultaneously and using the same technology, thus enabling a direct evaluation of the quality of the arrays on the basis of the test structure results.

Thirdly, the method described is straightforward and easy to implement, and the test structure easy to produce, with no need for special technology or alterations to existing production processes.

Figure 9:
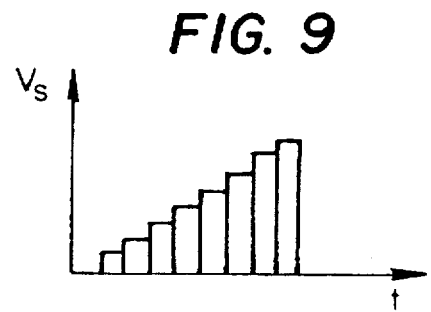
FIG. 9 shows the stress voltage according to a further embodiment.

To those skilled in the art it will be clear that changes may be made to the method and structure described and illustrated herein without, however, departing from the scope of the present invention. In particular, stress may be applied indifferently to the gate regions of the test structure cells (as in the embodiment described) or to the source regions, with positive voltages in relation to the substrate (as in FIG. 9), or to the drain regions. Measurement of the current at sub-threshold voltage may involve the drain or source current; while measurement of the characteristic may even involve transconductance as opposed to the drain or source currents. Also, stress may be applied differently from the manner described.

Though the above description relates to a flash-EEPROM memory, the method and test structure described may also be employed for evaluating EPROM and EEPROM memories, in which case, the test structure will be physically equivalent to the type of EPROM or EEPROM memory in question, by electrically connecting the control gate, source and drain lines. Finally, the type of stress applied need not necessarily be electrical, e.g. irradiation, providing it results in the removal of electrons from the floating gate of the defective cells.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for evaluating gate oxide of an erasable programmable non-volatile memory, the method comprising the steps of:

applying a stress to a plurality of cells so that a floating gate of each cell is positively charged when a gate oxide region separating the floating gate from a substrate region of that cell is defective, and not positively charged when the gate oxide region is non-defective, wherein each cell's floating gate is electrically neutral before the stress is applied;

removing the stress from the plurality of cells;

measuring a characteristic of the plurality of cells after the stress is removed; and determining defectiveness of the memory according to the measured characteristic.

2. The method of claim 1, wherein the step of applying includes a step of:

providing, as the stress, an electrical stress that is less than a tunneling stress required to cause Fowler-Nordheim tunneling in a cell having a non-defective gate oxide region.

3. The method of claim 1, wherein each cell further includes a control gate, and wherein the step of applying the stress includes a step of:

providing a negative voltage to the control gate of each cell so that, for each cell having a defective gate oxide region, electrons are removed from that cell's floating gate, and so that, for each cell having a non-defective gate oxide region, electrons are not removed from that cell's floating gate.

4. The method of claim 1, wherein each cell further includes a source, and wherein the step of applying the stress includes a step of:

providing a positive voltage to the source of each cell so that, for each cell having a defective gate oxide region, electrons are transferred from that cell's floating gate to that cell's source through that cell's defective gate oxide region, and so that, for each cell having a non-defective gate oxide region, electrons are not transferred from that cell's floating gate.

5. The method of claim 1, wherein the step of measuring includes generating a transconductance curve indicative of transconductance of the plurality of cells, wherein the step of determining includes detecting whether the transconductance curve includes at least one hump, and wherein the plurality of cells is determined to include at least one cell having a defective gate oxide region when the transconductance curve includes at least one hump.

6. The method of claim 1, wherein the step of measuring includes generating a drain current curve indicative of an aggregate drain current of the plurality of cells, wherein the step of determining includes detecting whether the drain current curve includes a tail, and wherein the plurality of cells is determined to include at least one cell having a defective gate oxide region when the drain current curve includes the tail.

7. The method of claim 1, wherein each cell further includes a source and a drain and a control gate; wherein the plurality of cells are included within a test structure that further includes a plurality of uninterruptible non-switchable drain lines that connects the drain of each cell together, a plurality of uninterruptible non-switchable source lines that connects the source of each cell together, and a plurality of uninterruptible non-switchable control gate lines that connects the control gate of each cell together, so that the plurality of cells cannot be individually addressed; wherein the test structure is formed on a wafer in which is further formed a memory structure having individually addressable cells; wherein the memory structure is the erasable programmable non-volatile memory being evaluated; and wherein the step of determining includes assessing defectiveness of the memory structure based on the measured characteristic of the plurality of cells of the test structure.

8. An apparatus for evaluating gate oxide of an erasable programmable non-volatile memory, the apparatus comprising:

a stress application circuit to apply a stress to a plurality of cells so that a floating gate of each cell is positively charged when a gate oxide region separating the floating gate from a substrate region of that cell is defective, and not positively charged when the gate oxide region is non-defective, wherein each cell's floating gate is electrically neutral before the stress is applied;

a measuring circuit to measure a characteristic of the plurality of cells after the stress is removed from the plurality of cells; and a determining circuit to determine defectiveness of the memory according to the measured characteristic.

9. The apparatus of claim 8, wherein the stress application circuit includes:

circuitry to provide, as the stress, an electrical stress that is less than a tunneling stress required to cause Fowler-Nordheim tunneling in a cell having a non-defective gate oxide region.

10. The apparatus of claim 8, wherein each cell further includes a control gate, and wherein the stress application circuit includes:

circuitry to provide a negative voltage to the control gate of each cell so that, for each cell having a defective gate oxide region, electrons are removed from that cell's floating gate, and so that, for each cell having a non-defective gate oxide region, electrons are not removed from that cell's floating gate.

11. The apparatus of claim 8, wherein each cell further includes a source, and wherein the stress application circuit includes:

circuitry to provide a positive voltage to the source of each cell so that, for each cell having a defective gate oxide region, electrons are transferred from that cell's floating gate to that cell's source through that cell's defective gate oxide region, and so that, for each cell having a non-defective gate oxide region, electrons are not transferred from that cell's floating gate.

12. The apparatus of claim 8, wherein the measuring circuit includes curve generating circuitry to generate a transconductance curve indicative of transconductance of the plurality of cells, wherein the determining circuit includes detecting circuitry to detect whether the transconductance curve includes at least one hump, and wherein the plurality of cells is determined to include at least one cell having a defective gate oxide region when the transconductance curve includes at least one hump.

13. The apparatus of claim 8, wherein the measuring circuit includes curve generating circuitry to generate a drain current curve indicative of an aggregate drain current of the plurality of cells, wherein the determining circuit includes detecting circuitry to detect whether the drain current curve includes a tail, and wherein the plurality of cells is determined to include at least one cell having a defective gate oxide region when the drain current curve includes the tail.

14. The apparatus of claim 8, wherein each cell further includes a source and a drain and a control gate; wherein the plurality of cells are included within a test structure that further includes a plurality of uninterruptible non-switchable drain lines that connects the drain of each cell together, a plurality of uninterruptible non-switchable source lines that connects the source of each cell together, and a plurality of uninterruptible non-switchable control gate lines that connects the control gate of each cell together, so that the plurality of cells cannot be individually addressed; wherein the test structure is formed on a wafer in which is further formed a memory structure having individually addressable cells; wherein the memory structure is the erasable programmable non-volatile memory being evaluated; and wherein the determining circuit includes circuitry to assess defectiveness of the memory structure based on the measured characteristic of the plurality of cells of the test structure.

15. An apparatus for evaluating gate oxide of an erasable programmable non-volatile memory, the apparatus comprising:

means for applying a stress to a plurality of cells so that a floating gate of each cell is positively charged when a gate oxide region separating the floating gate from a substrate region of that cell is defective, and not positively charged when the gate oxide region is non-defective, wherein each cell's floating gate is electrically neutral before the stress is applied;

a measuring circuit to measure a characteristic of the plurality of cells after the stress is removed from the plurality of cells; and a determining circuit to determine defectiveness of the memory according to the measured characteristic.

* * * * *